United States Patent [19]

Mappin et al.

[11] Patent Number: 4,796,042

[45] Date of Patent: Jan. 3, 1989

[54] PRINTING PLATE PROCESSOR HAVING RECIRCULATING WATER WASH RECLAMATION

[75] Inventors: Carlton D. Mappin, Mahway; Thomas N. Gillich, Whitehouse Station, both of N.J.

[73] Assignee: Hoechst Celanese Corp., Somerville, N.J.

[21] Appl. No.: 80,136

[22] Filed: Jul. 31, 1987

[51] Int. Cl.⁴ .............................................. G03D 3/06
[52] U.S. Cl. ................................ 354/324; 134/10; 134/18; 134/56 R; 134/113; 210/96.1
[58] Field of Search ............... 354/317, 319, 320, 321, 354/322, 324, 325; 15/102; 134/10, 18, 56 R, 57 R, 58 R, 113, 28; 210/96.1, 167, 171

[56] References Cited

U.S. PATENT DOCUMENTS

| | | | |
|---|---|---|---|
| 3,589,261 | 6/1971 | Krikelis | 354/325 |
| 3,733,994 | 5/1973 | Armstrong et al. | 354/324 |
| 3,771,428 | 11/1973 | Horner et al. | 15/102 |
| 3,809,105 | 5/1974 | Horner | 15/102 |
| 3,995,343 | 12/1976 | Horner | 354/297 |
| 4,081,577 | 3/1978 | Horner | 354/325 |
| 4,091,404 | 5/1978 | Schornig et al. | 354/325 |
| 4,239,368 | 12/1980 | Krause et al. | 354/325 |
| 4,577,948 | 3/1986 | Lawson et al. | 354/324 |

Primary Examiner—A. A. Mathews
Attorney, Agent, or Firm—Richard S. Roberts

[57] ABSTRACT

A wash water reclamation system for a printing plate processor having an external reservoir, wash water pumping and collecting means and means for continuously measuring wash water pH and conductivity. Conductivity and pH are automatically adjusted at predetermined levels.

18 Claims, 1 Drawing Sheet

PRINTING PLATE PROCESSOR HAVING RECIRCULATING WATER WASH RECLAMATION

BACKGROUND OF THE INVENTION

The present invention relates an improved apparatus in the art of machine spraydeveloping of lithographic printing plates or cleaning, etching and chemical processing flat sheets.

In the field of preparing lithographic printing plates, light sensitive coatings are placed upon a support, usually a flexible, thin metal sheet, thus creating a presensitized printing plate. The plate is subjected to imagewise exposure through a mask which renders the photosensitive substance insoluble in a suitably chosen developer, if it is negative working, and soluble in the developer, if the plate is positive working. The action of the developer, in the case of lithographic plate, is to remove the non-image portions of the plate coating completely so that no trace of it remains on the metal support. The metal support, so revealed, is now free of coating and will no longer accept ink. This sharp discrimination between image and non-image areas on the plate is vital to success in the preparation of the lithographic plate.

Exposed lithographic plates may be developed by hand or by machine. If developed by hand, developer is poured both upon the plate and upon a soft sponge or pad and rubbed therewith upon the surface of the plate until, by inspection, the non-image areas are completely removed. Care must be taken to avoid any damage to the image by excessive rubbing, or by the use of an overly active chemical developer.

The disadvantages of hand development of offset printing plates are numerous. The process is slow and expensive. Uniformity of pressure in applying the developing solution to remove the undesired coating is almost impossible to attain and exposure to the developing solution is uneven, Thus, defective printing often results from an inadequate development or underdevelopment of an area of from applying varying pressure by hand, which may adversely affect the desired printing image. Drying of the developer on certain portions of the plate before it can be rubbed in to remove the undesired coating also may leave a residue on the plate. A further difficulty with the hand method is in the application of the developing solution. It is presently the practice of the craftman to pour a quantity of developer onto a developing sponge or pad and onto the center of the plate, which quantity is supposedly sufficient to process the plate, and the craftman then works his sponge from the "reservoir." This procedure may lead to a high degree of contamination of the processing fluids by the removed photosensitive coating as well as a change in the chemistry of the fluid because of evaporation, which will, in turn, either reduce the efficiency of the chemistry resulting in incomplete removal of the undesired coating in highly critical areas of halftones, or increase its potency resulting in image attack.

Further, the development of a two-sided plate by developing one side at a time in a sink and turning the plate over can result in damage to the first developed side by pieces of contaminated material in the sink being forced back into the image or non-image areas of the first developed side when the second side is developed.

These defects may not become apparent until the plate is clamped into a printing press and the expense of developing the plate has been incurred. All of these problems become more critical with increasing plate sizes.

When many plates are to be developed, machinery is used which will develop the plate by applying developer mechanically.

Automatic processors are available which overcome the difficulties associated with the conventional hand development of such plates by providing an enclosed developer apparatus which includes a receiving station for receiving a printing plate, continuous transport system, a developing station in which the developer is applied to both side of the plate simultaneously and evenly over the complete surface of both sides, including a pre-soak section to soften the coating, a rubbing or scrubbing section consisting of a free-floating assembly of a set of cleaning brushes and a set of velour type cloth coated scrubber pads mounted one above and one below the plate in such a manner as to facilitate easy entrance of the plate between the cleaning brushes and scrubber pads. The entire cleaning and scrubbing assembly is further capable of a reciprocating movement traversely across the surface of the plate, each half in a direction opposite to the other. When no plate is in the developing system, the top and bottom cleaning and scrubbing devices rub against each other. Attached to the end of the assembly are furthermore squeegee means which contact the following transport squeegee rollers for reasons described below.

Prior to entering the cleaning and scrubbing section as just described, the developer is applied onto both sides of the plate in a unique pre-soak chamber. While the plate is being moved forward through the pre-soak chamber, the coating on the non-image areas is softened, enabling the following cleaning and scrubbing assembly to effectively clean or remove all unwanted coating even in the smallest areas. This assures a highest quality image. Developer is further applied to the plate continuously in the cleaning and scrubbing section, both through the actual cleaning brushes and between the scrubber pads. The plates then enter a wash water stage for the removal of excess developer and removed excess non-image plate materials. In some existing machines, developer is metered to the plate through tubes and spread about by sponges or brushes which also serve to separate loosened non-image particles from the plate support. In the next stage, within the machine, the spent developer and separated non-image coating are rinsed from the plate, usually with water, supplied through tubes. In a final stage, the rinsed, moist surface is covered with a gum solution and any excess thereof is removed, thereby delivering a plate ready for the press or for storage. The gum solution is also metered to the plate through tubes.

In some cases, these processing solutions are pumped through spray nozzles which are directed upon the plate surface. In further refinements, the developer and gum solution overflows are returned to reservoirs from which they are again pumped through the spray nozzles.

In the case of developers for certain positive working plates, recirculation is not feasible due to the aeration of the developer. In this case, to avoid aeration, only fresh developer may be applied to the plate.

With regard to developing machinery utilized in the graphic arts, other objects are:

to reduce the needed quantities of valuable developers and finishing agents;

to increase the speed of operation;

to increase the completeness of development;
to increase the discrimination between image and non-image areas; and
to permit the use of less aggressive developer, and thus decrease damage to the image In machinery for the processing of exposed lithographic printing plates, the plate is usually transported under spray heads through which developing solutions, rinses and finishing solutions, as determined by the needs of the individual plate, are sequentially dispensed. Appropriate time intervals are provided for the action of each solution, optionally assisted by soft non-scratching brushes, scrubbing pads, squeegees and the like.

Plate processor are per se well known in the art as exemplified by U.S. Pat Nos. 4,239,368; 3,995,343; 3,937,175; 3,738,249; 3,809,105; 3,771,428; 4,081,577; and 4,091,404 which are incorporated herein by reference.

A problem with the heretofore known processors is their excessive use of wash water. Indeed, it is the experience of large press shops that the annual cost of the wash water alone which is pumped through the processor, vastly exceeds the cost of the processor equipment itself. If a wash water is used on a "one shot" basis it is discarded after the single use although it still has substantial residull washing ability. As a result of this capacity, prnnters desire to use wash water in processing machines again and again to gain greater economics. However, as the non-image areas of the photographic surface of the plate are removed, they are carried away and contaminate the water. Processors frequently have filters which remove flaked off coating particles to prevent a redeposit of these coatng flakes onto the plate. Such a processor is shown in U.S. Pat. No. 4,239,368. However, over time, the non-filterable portion of the liquid wash water is itself contaminated with unfiltered components. These are typically alkaline coating components which unacceptably raise the pH of the solution. In such an event, the solution is either discarded, or upon periodic monitoring of pH by the printer, an amount of fresh water is added. These, however, are short-term fixes to the problem because the solution is not continuously monitored and because the addition of such neutralizing acids may restore the pH to neutral but the conductivity of the solution increases to such an extent that the wash water quickly becomes unworkable. The present invention provides an improved processor for lithographic printing plates wherein pH and conductivity are continuously monitored and pH adjusting solution is automatically added as needed while maintaining wash water conductivity within an acceptable working range.

SUMMARY OF THE INVENTION

The invention provides a printing plate processor recirculating wash water reclamation system which comprises:
  a. a plate processor having an enclosed housing capable of containing wash water therein, said processor having a plate inlet and a plate outlet and means for applying wash water to a plate between said inlet and said outlet; and
  b. a wash water reservoir external to said housing; and
  c. means for pumping wash water from the reservoir to the wash water applying means of the processor; and
  d. means for collecting wash water from the wash water applying means of the processor and returning it to the reservoir; and
  e. means for continuously and automatically measuring the pH of the wash water in the reservoir; and
  f. injection means responsive to said pH measuring means capable of automatically adding a pH adjusting composition to the wash water in the reservoir at a predetermined pH.

The invention further provides a method of extending the useful lifetime of wash water used in a printing plate processing apparatus which method comprises:
  a. providing a wash water reservoir external to said processor and pumping wash water from the reservoir to the processor, and collecting used wash water from the processor and returning it to said reservoir; and
  b. automatically and continuously measuring the pH of the wash water in the reservoir; and
  c. automatically injecting a pH adjusting composition into the wash water in the reservoir and maintaining the pH of the wash water in a predetermined range.

DETAILED DESCRIPTION OF THE PREFERRED EMBODIMENT

Figure 1:
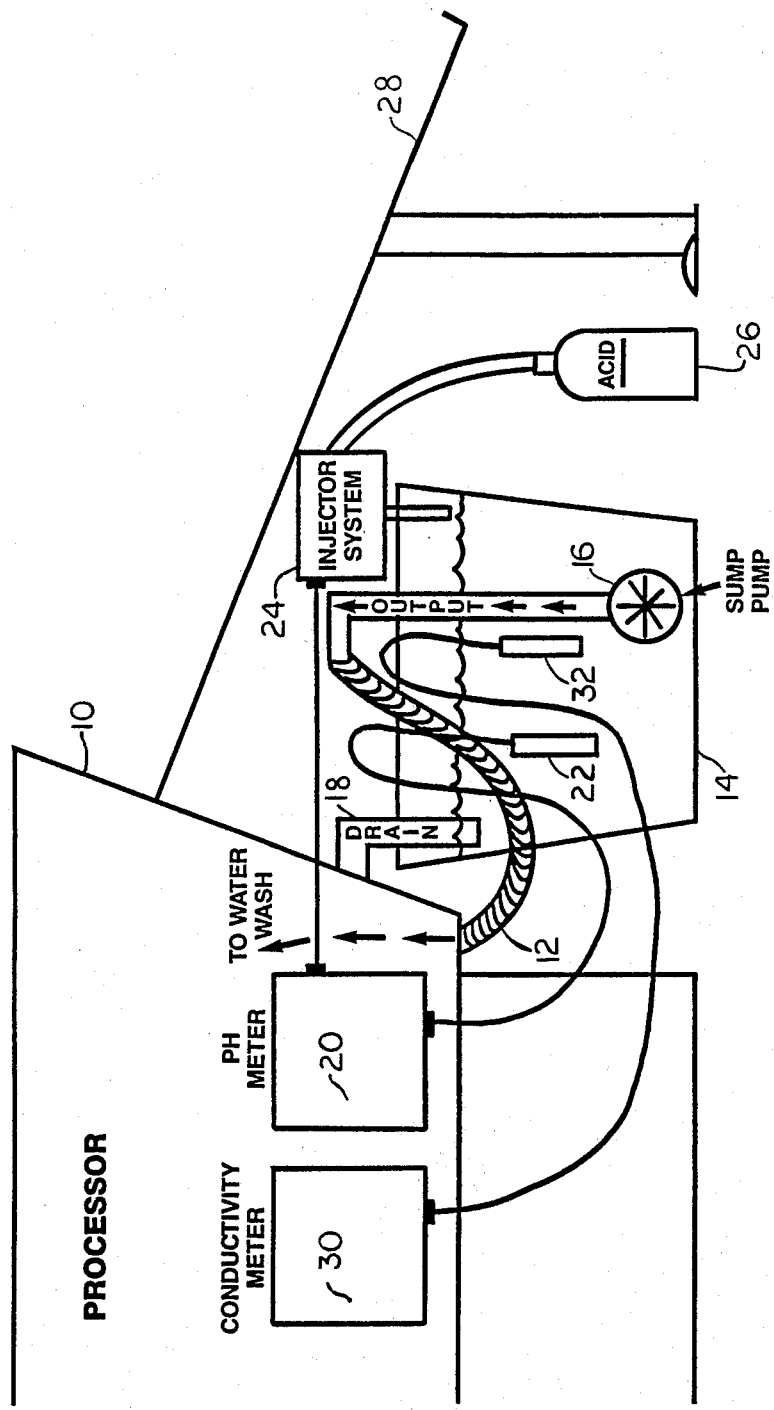
FIG. 1 shows a schematic view of a recirculating wash water reclamation system according to the invention.

As shown in FIG. 1, a typical plate processor 10 has its wash water input hose 12 connected to an external reservoir 14 instead of a fresh water tap. In the preferred embodiment reservoir 14 is a 40- to 55-gallon tank. Hose 12 is connected to sump pump 16. In operation sump pump 16 pumps water from reservoir 14 to the wash water stage of the plate processor 10. Used wash water is returned to the reservoir from the processor via drain 18. A pH meter 20 continuously monitors the pH of the reservoir water via probe 22. The pH meter provides a continuous monitoring of the water pH and when the pH reaches a certain predetermined value, the pH meter signals injector system 24 to supply a pH adjusting composition, such as an acid, from tank 26. In the preferred embodiment, when the pH becomes too high as the result of plate wash residue, a small amount of citric acid neutralizes the reservoir water. A preferred pH range is from about 6.5 to about 7.5, more preferably from about 6.8 to about 7.2 and most preferably about 7.0. The injection system 24 comprises a solenoid valve and pump, not shown, which are well known to the skilled artisan. FIG. 1 also shows a typical exit slide and stand 28 for completed processed plates. The preferred embodiment also provides continuous automatic measurement of wash water conductivity via conductivity meter 30. The meter comprises probe 32 positioned in the wash water reservoir. When fresh tap water is used to charge the system initially, it has a conductivity of about 100–150 mhos. As plates are washed and acid is added to neutralize the alkalinity, ionized species are added to the system and conductivity gradually rises. When the conductivity rises to a disadvantageous level, such may be signalled by alarm means, not shown, and the wash water should then be changed. Conductivity could optionally be lowered by merely adding fresh tap water, but this is only a temporary solution. The most economical procedure would be to completely exchange the wash water at this point, i.e., when conductivity exceeds about 5,000 to about 8,000 mhos.

It will be obvious to those skilled in the art that many modifications may be made within the scope of the present invention without departing from the spirit thereof, and the invention includes all such modifications.

What is claimed is:

1. A printing paate processor recirculating wash water reclamation system which comprises:
    a. a plate processor having an enclosed housing capable of containing wash water therein, said processor having a plate inlet and a plate outlet and means for applying wash water to a plate between said inlet and said outlet; and
    b. a wash water reservoir external to said housing; and
    c. means for pumping wash water from the reservoir to the wash water applying means of the processor; and
    d. means for collecting wash water from the wash water applying means of the processor and returning it to the reservoir; and
    e. means for continuously and automatically measuring the pH of the wash water in the reservoir; and
    f. injection means responsive to said pH measuring means capable of automatically adding a pH adjusting composition to the wash water in the reservoir at a predetermined pH.

2. The system of claim 1 further comprising means for continuously and automatically measuring the conductivity of wash water in the reservoir.

3. The system of claim 2 further comprising alarm means for signalling when the wash water conductivity reaches a predetermined amount.

4. The system of claim 2 further comprising second injection means responsive to said conductivity measuring means, capable of automatically adding a conductivity adjusting composition to the wash water in the reservoir at a predetermined conductivity.

5. The system of claim 1 wherein said processor further comprises plate scrubbing means.

6. The system of claim 1 wherein said processor further comprises plate transport means.

7. A method of extending the useful lifetime of wash water used in a printing plate processing apparatus which method comprises:
    a. providing a wash water reservoir external to said processor and pumping wash water from the reservoir to the processor, and collecting used wash water from the processor and returning it to said reservoir; and
    b. automatically and continuously measuring the pH of the wash water in the reservoir; and
    c. automatically injecting a pH adjusting composition into the wash water in the reservoir and maintaining the pH of the wash water in a predetermined range.

8. The method of claim 7 wherein said pH range extends from about 6.5 to about 7.5.

9. The method of claim 7 wherein said pH range extends from about 6.8 to about 7.2.

10. The method of claim 7 wherein said pH adjusting composition comprises an acid.

11. The method of claim 7 wherein said pH adjusting composition comprises citric acid.

12. The method of claim 7 further comprising automatically and continuously measuring the conductivity of the wash water.

13. The method of claim 12 further comprising signalling the condition of the wash water by using a conductivity of a predetermined amount.

14. The method of claim 12 further comprising automatically injecting a conductivity adjusting composition into the wash water and maintaining the conductivity of the wash water in a predetermined range.

15. The method of claim 14 wherein said conductivity range extends from about 5,000 to about 8,000 mhos.

16. The method of claim 14 wherein said conductivity adjusting composition comprises water.

17. The method of claim 13 further comprising discarding the wash water after the signalling condition is attained.

18. The method of claim 14 wherein said discarding is performed after the water conductivity exceeds about 5,000 mhos.

* * * * *